(12) United States Patent
Koo et al.

(10) Patent No.: US 8,916,056 B2
(45) Date of Patent: Dec. 23, 2014

(54) BIASING SYSTEM FOR A PLASMA PROCESSING APPARATUS

(71) Applicants: Bon-Woong Koo, Andover, MA (US); Richard M. White, Newmarket, NH (US)

(72) Inventors: Bon-Woong Koo, Andover, MA (US); Richard M. White, Newmarket, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 57 days.

(21) Appl. No.: 13/649,159

(22) Filed: Oct. 11, 2012

(65) Prior Publication Data

US 2014/0106571 A1    Apr. 17, 2014

(51) Int. Cl.
    B44C 1/22       (2006.01)
    H01L 21/302     (2006.01)
    C23C 16/503     (2006.01)

(52) U.S. Cl.
    USPC ............... 216/67; 438/710; 438/905; 134/1.1

(58) Field of Classification Search
    USPC .................. 216/67; 438/710, 905; 134/1.1
    See application file for complete search history.

(56) References Cited

U.S. PATENT DOCUMENTS

| | | | |
|---|---|---|---|
| 5,911,832 A | | 6/1999 | Denholm et al. |
| 6,033,990 A | * | 3/2000 | Kishimoto et al. ........... 438/710 |
| 6,225,633 B1 | * | 5/2001 | Sun et al. ...................... 250/389 |
| 6,632,482 B1 | | 10/2003 | Sheng |
| 6,897,155 B2 | * | 5/2005 | Kumar et al. ................. 438/706 |
| 2009/0200461 A1 | * | 8/2009 | Raj et al. ....................... 250/287 |
| 2010/0107980 A1 | * | 5/2010 | Horsky et al. ............. 118/723 E |
| 2011/0309049 A1 | * | 12/2011 | Papasouliotis et al. ......... 216/37 |

* cited by examiner

*Primary Examiner* — Shamim Ahmed

(57) ABSTRACT

A plasma processing apparatus includes a process chamber housing defining a process chamber, a platen positioned in the process chamber for supporting a workpiece, a source configured to generate plasma in the process chamber, and a biasing system. The biasing system is configured to bias the platen to attract ions from the plasma towards the workpiece during a first processing time interval and configured to bias the platen to repel ions from the platen towards interior surfaces of the process chamber housing during a cleaning time interval. The cleaning time interval is separate from the first processing time interval and occurring after the first processing time interval.

10 Claims, 4 Drawing Sheets

BIASING SYSTEM FOR A PLASMA PROCESSING APPARATUS

FIELD

This disclosure relates generally to plasma processing, and more particularly to a biasing system for a plasma processing apparatus.

BACKGROUND

A plasma processing apparatus generates plasma in a process chamber. A workpiece supported by a platen is positioned in the process chamber. The plasma processing apparatus may include, but not be limited to, doping systems, etching systems, and deposition systems. One drawback with a conventional plasma processing apparatus is cross contamination if one input process gas is changed to a different input process gas. This is due to deposits that form on the interior surfaces of the process chamber housing that may contaminate the later process. For example, a plasma doping apparatus may receive a p-type process gas such as $BF_3$ and boron deposits may build up over time on interior surfaces and components. If it is desired to change the $BF_3$ process gas to an n-type process gas such as $PH_3$, the boron deposits would likely contribute to cross contamination problems if not cleaned properly. Accordingly, a conventional cleaning process may be run to clean the interior surfaces of the process chamber.

A conventional cleaning process may input a fluorine containing gas directly input to the process chamber or may use a remote plasma generator to generate many fluorine radicals. In either instance, the cleaning takes place via a chemical reaction within the process chamber. One drawback with this conventional cleaning process is that it requires a flow rate as high as 500-2,000 standard cubic centimeters per minute (SCCM) for the cleaning gas. Another drawback is that the process chamber is operated at high pressure as high as several hundred mTorr to several Torr during the cleaning process. Reaching this high pressure takes time as some pumps such as a turbo molecular pump may be shut down and alternative mechanical pumps are employed to maintain the high pressure during the cleaning process. The chemical reaction at the high pressure and flow rate may be so aggressive that it damages the interior surfaces of the process chamber housing and components in the process chamber such as a shield ring that may surround the platen. Yet another drawback is that this makes it inefficient to switch between different process gases in the same process chamber.

Accordingly, there is a need for a plasma processing apparatus and a method which overcomes the above described inadequacies and shortcomings.

SUMMARY

According to a first aspect of the disclosure, a plasma processing apparatus is provided. The plasma processing apparatus includes a process chamber housing defining a process chamber, a platen positioned in the process chamber for supporting a workpiece, a source configured to generate a plasma in the process chamber, and a biasing system. The biasing system is configured to bias the platen to attract ions from the plasma towards the workpiece during a first processing time interval and configured to bias the platen to repel ions from the platen towards interior surfaces of the process chamber housing during a cleaning time interval separate from the first processing time interval and occurring after the first processing time interval.

According to another aspect of the disclosure, a method is provided. The method includes: inputting a first process gas into a process chamber; generating a first plasma from the first process gas; attracting ions of the first plasma towards a workpiece during a first processing time interval; stopping a flow of the first process gas into the process chamber; inputting a cleaning gas into the process chamber; generating a cleaning plasma from the cleaning gas; and accelerating ions of the cleaning plasma towards interior surfaces of the process chamber housing during a cleaning time interval separate from the first processing time interval.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
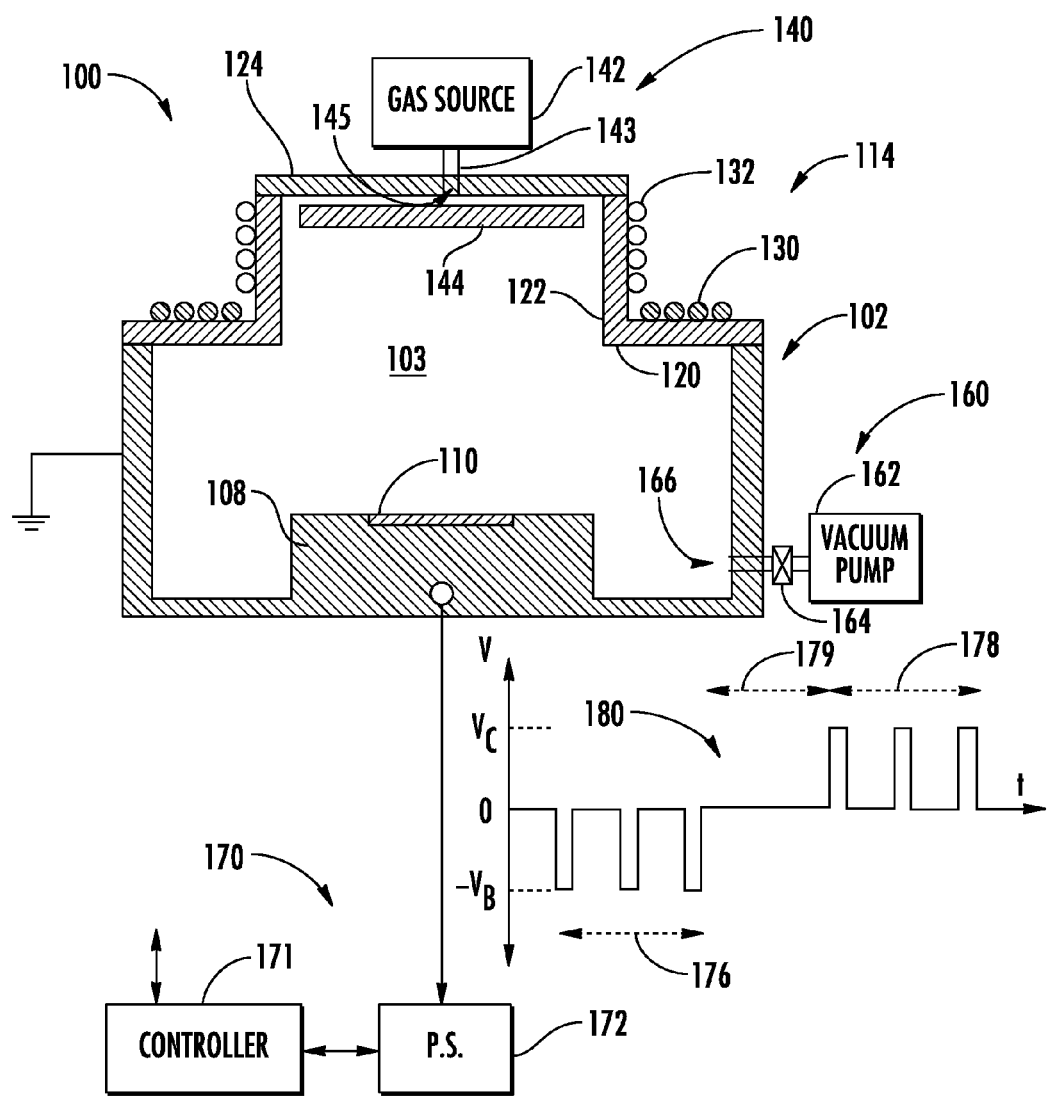
FIG. 1 is a block diagram of a plasma processing apparatus having a biasing system consistent with an embodiment of the present disclosure.

Turning to FIG. 1, a block diagram of a plasma processing apparatus 100 consistent with the present disclosure is illustrated. The plasma process apparatus 100 is further described herein as a plasma doping apparatus. However, the plasma processing apparatus 100 may also include, but not be limited to, etching and deposition systems.

The plasma processing apparatus 100 includes a process chamber housing 102 defining a process chamber 103, a platen 108 to support a workpiece 110 within the process chamber 103, a source 114 configured to generate plasma within the process chamber 103, a gas supply system 140, a vacuum pumping system 160, a biasing system 170, and a controller 171. The workpiece 110 may include, but not be limited to, a semiconductor wafer, a solar cell, a flat panel, and a polymer substrate. The semiconductor wafer may have a disk shape with a diameter of 300 millimeters (mm). The process chamber housing 102 may have grounded sections. The process chamber housing may have a first section 120 formed of a dielectric material that extends in a generally horizontal direction, and another section 122 also formed of a dielectric material that extends a height from the first section 120 in a generally vertical direction. The process chamber housing 102 may also include a lid 124 formed of an electrically and thermally conductive material that extends across the second section 122 in a horizontal direction.

The source 114 is configured to generate plasma within the process chamber 103. The source 114 may be any type of plasma source and is illustrated as an RF source in FIG. 1. The RF source may include an RF power supply (not illustrated) to supply RF power to either one or both of the planar antenna 130 and the helical antenna 132 to generate the plasma.

The gas supply system 140 may include a gas source 142 to provide one or more different process gases and one or more cleaning gases to the process chamber 103 via a conduit 143 and a gas inlet 145 positioned above a gas baffle 144. The gas baffle 144 may be positioned in the process chamber 103 to deflect the flow of gas from the gas source 142. The vacuum pumping system 160 establishes a desired pressure in the process chamber 103. The vacuum pumping system 160 may include at least one vacuum pump 162 to evacuate the process chamber 103 through an exhaust port 166. An exhaust valve 164 controls the exhaust conductance through the exhaust port 166. The vacuum pumping system 160 may be controlled by the controller 171 to maintain a desired pressure in the process chamber 103 by controlling the exhaust conductance with the exhaust valve 164 or a gas flow rate from the gas source 142 in a feedback loop that is responsive to a sensed pressure within the process chamber 103.

The biasing system 170 may be configured to bias the platen 108 to attract ions from the plasma towards the workpiece 110 during a processing interval and to repel ions from the platen 108 towards interior surface of the process chamber housing 102 during a cleaning time interval. The biasing system 170 may include a dual polarity DC power supply 172 configured to provide a pulsed DC bias signal 180 to the platen 108. The amplitude, duty cycle, frequency, and polarity of the pulsed DC bias signal 180 may be varied as detailed herein.

The controller 171 can be or include a general-purpose computer or network of general-purpose computers that may be programmed to perform desired input/output functions. The controller 171 can also include other electronic circuitry or components, such as application specific integrated circuits, other hardwired or programmable electronic devices, discrete element circuits, etc. The controller 171 may also include communication devices, data storage devices, and software. The controller 171 may receive input signals from a variety of systems and components of the plasma processing apparatus 100 to determine a condition of one or more systems and components and also to control the same. For example, the controller 171 may control the dual polarity power supply 172, the vacuum pumping system 160, and the flow of gas from the gas source 142.

In operation, the vacuum pumping system 160 established a desired pressure within the process chamber 103 that may be less than or equal to 10 mTorr or about 1-10 mTorr in one instance. A workpiece handling system (not illustrated) may include one or more robots and associated load locks to place the workpiece 110 on the platen 108. A first process gas from the gas source 142 is input to the process chamber 103 and is ionized by the source 114 to generate plasma within the process chamber 103. The biasing system 170 is configured to bias the platen 108 and hence the workpiece 110 to attract ions from the plasma towards the workpiece 108. The dual polarity power supply 172 may provide a pulsed DC bias signal 180. During a first processing time interval 176, the dual polarity power supply 172 may provide a negatively pulsed DC signal having a negative amplitude ($-V_B$) selected to provide a desired energy to the ions. The negatively pulsed DC signal may have a frequency of about 1 kHz, an amplitude of about -1 kV, and a duty cycle of about 10-20%. After the first processing time interval 176, the gas supply system 140 may stop the flow of the first process gas and allow an additional time interval 179 for the workpiece handling system to remove the workpiece 110 from the process chamber 103. The gas supply system 140 may then start the flow of a cleaning gas into the process chamber 103. The flow rate may be about 1-20 SCCM. The cleaning gas may be a fluoride containing gas such as $CF_4$, $NF_3$, or $SF_6$. The cleaning gas may also be Argon or Xenon. A cleaning plasma may then be generated from ionizing the cleaning gas.

During a cleaning time interval 178, the dual polarity power supply 172 may provide a positively pulsed DC signal having positive amplitude ($V_C$) selected to provide a desired energy to the ions of about $eV_C$. The ions are repelled from the platen 108 and towards interior surfaces of the process chamber housing 102 and any other components in the process chamber 103 such as the gas baffle 144. The positively pulsed DC signal may have a frequency of about 1 kHz, an amplitude of about 1 kV to provide 1 keV of energy to ions striking surfaces to be cleaned, and a duty cycle of about 10%. The amplitude $V_C$, frequency, and duty cycle may be optimized for differing chamber conditions and cleaning gases. The vacuum system 160 may maintain the low pressure in the process chamber 103 of about less than or equal to 10 mTorr established during the first processing time interval throughput the interim time interval 179 and the cleaning time interval 178. In addition, the flow rate of the cleaning gas as controlled by the gas supply system 140 may be kept to a low level of about 1-20 SCCM during the cleaning time interval 178.

Figure 2:
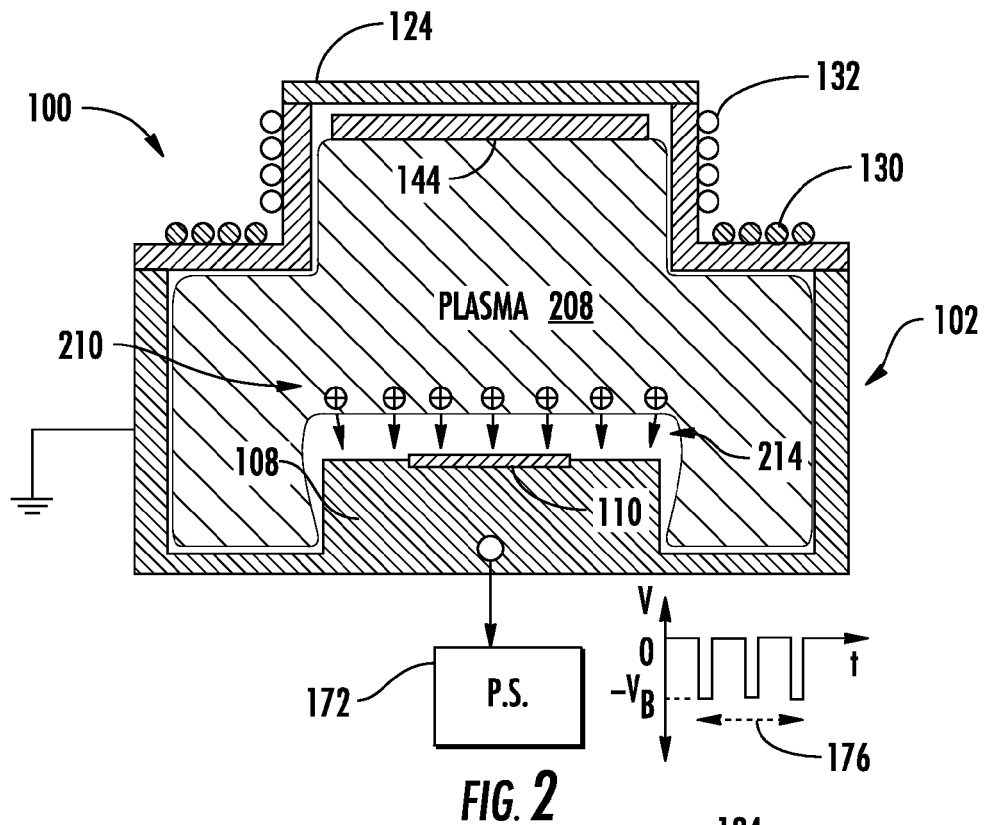
FIG. 2 is a block diagram of the plasma processing apparatus of FIG. 1 during a processing time interval.

Turning to FIG. 2, a block diagram of the plasma processing apparatus 100 showing plasma 208 and positively charged ions 210 accelerated towards the workpiece 110 during the first process time interval 176 is illustrated. The positively charged ions 210 are accelerated at an energy of about $eV_B$ during the first process time interval 176. Some of the components of FIG. 1 are missing in FIG. 2 for ease of illustration and any repetitive description of similarly labeled components is omitted herein. The negatively pulsed DC signal creates a plasma sheath 214 proximate the workpiece 110 and accelerates positively charged ions 210 across the plasma sheath 214 towards the workpiece 110 with an energy of about $eV_B$. If the amplitude ($-V_B$) is large enough, the positively charged ions 210 have enough energy to be implanted into the workpiece 110.

Figure 3:
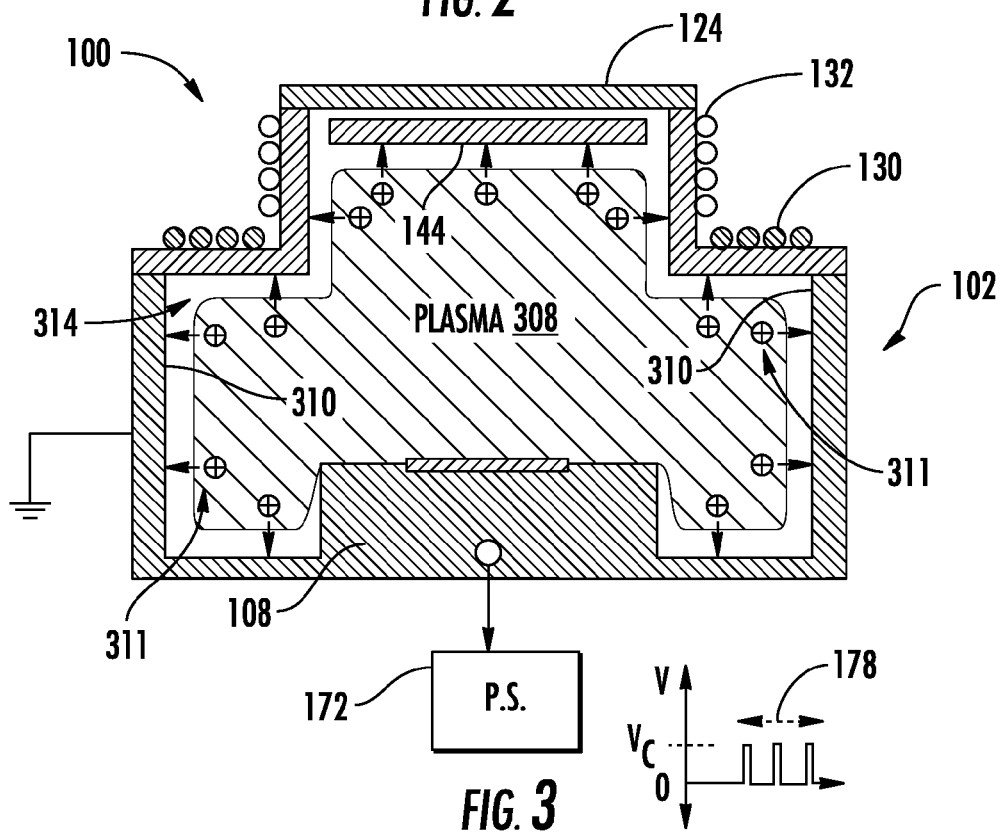
FIG. 3 is a block diagram of the plasma processing apparatus of FIG. 1 during a cleaning time interval.

In contrast, FIG. 3 illustrates the plasma processing apparatus 100 of FIG. 1 during the cleaning time interval 178. Plasma 308 is generated by ionizing a cleaning gas input to the process chamber 103. The dual polarity power supply 172 provides a positively pulsed DC signal during the cleaning time interval 178 to create a plasma sheath 314 proximate interior surfaces 310 of the process chamber housing 102 and accelerate positively charged ions 311 across the plasma sheath 314 towards surfaces and components to be cleaned at an energy of about $eV_C$.

Figure 4:
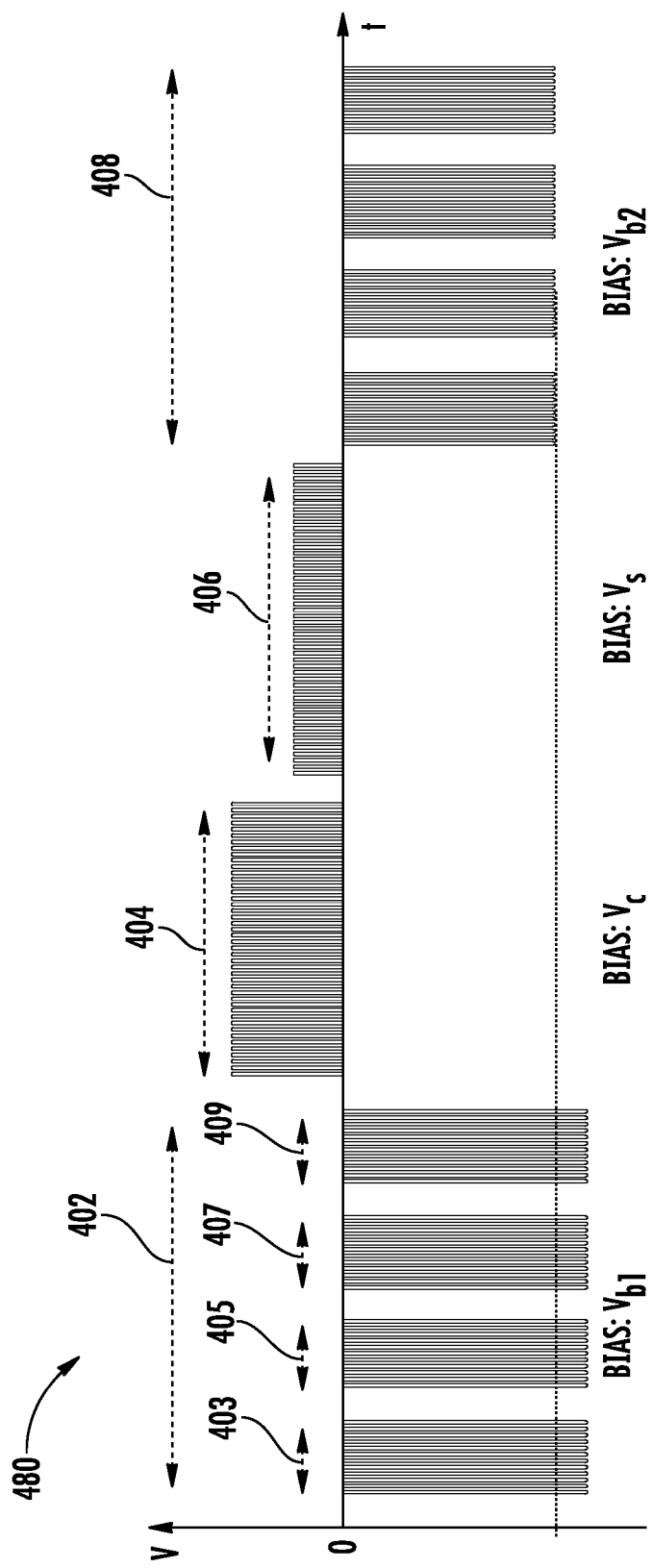
FIG. 4 is a plot of an output bias signal from the dual polarity power supply of FIG. 1.

Turning to FIG. 4, one exemplary output signal 480 from the dual polarity DC power supply 172 of FIG. 1 is illustrated. The output signal 480 provides a first processing time interval 402, followed by a cleaning time interval 404, a conditioning time interval 406, and a second processing time interval 408. During the first processing time interval 402, a first process gas such as a p-type process gas may be input into the process chamber 103. The first process gas may be $BF_3$, $B_2F_4$, or $B_2H_6$ containing a p-type dopant such as boron. A first plasma is generated from ionizing the first process gas and the dual polarity power supply 172 may provide a negatively pulsed DC signal to the platen having a negative amplitude $V_{b1}$. Four separate workpieces may be treated during four separate time intervals 403, 405, 407, 409 and the time between each time interval 403, 405, 407, 409 represents a bias power off period. Workpieces may be removed and inserted by the workpiece handling system during the bias off periods. During the first processing time interval 402, deposits such as boron may form on the interior surfaces 310 of the process chamber housing 102 and other components in the process chamber 103.

After the first processing time interval 402, the first process gas flow is stopped and a cleaning gas in input into the process chamber 103 and ionized. The cleaning gas may be a fluoride containing gas such as $CF_4$, $NF_3$, or $SF_6$. The cleaning gas may also be Argon or Xenon or mixtures such as $Xe/H_2$, Ar/F, etc. The dual polarity power supply 172 may provide a positively pulsed DC signal to the platen 108 having a positive amplitude ($V_C$) during the cleaning time interval 404. In one example, $V_C$ may be 1 kV or greater to provide sufficient energy for an effective ion assisted cleaning. The duty cycle and frequency of the positively pulsed DC signal may be varied according to a particular cleaning recipe.

After the cleaning time interval 404, the flow of cleaning gas is stopped and a second process gas may be input into the process chamber. The second process gas may be $AsH_3$, $AsF_5$, $PH_3$, or $PF_3$ containing an n-type dopant such as As or P. During an optional conditioning or seasoning time interval 406, the dual polarity power supply 172 may provide a positively pulsed DC signal to the platen 108 having a positive amplitude $V_S$, where $V_S$ is less than $V_C$. The amplitude ($V_S$) may be just great enough to treat the interior surfaces of the process chamber housing 102 and components in the process chamber 103 with the new chemical species. Thus, the conditioning or seasoning process may be done at a relatively low bias voltage where $V_S$ is 100-500 V. Once conditioning is complete, the second processing time interval 408 may begin with the dual polarity power supply 172 providing a negatively pulsed DC signal to the platen having negative amplitude $V_{b2}$. Ions from the second plasma generated during the second processing time interval 404 are accelerated towards the platen 108. The platen 108 may support a workpiece that was previously treated during the first processing time interval 402. One example of a workpiece that may be treated during the first processing time interval 402 and the second processing time interval 408 is an interdigitated solar cell with alternating p-type and n-type regions. Alternately, another workpiece not treated during the first processing time interval 402 may be supported by the platen 108 during the second processing time interval 408.

Figures 5, 6:
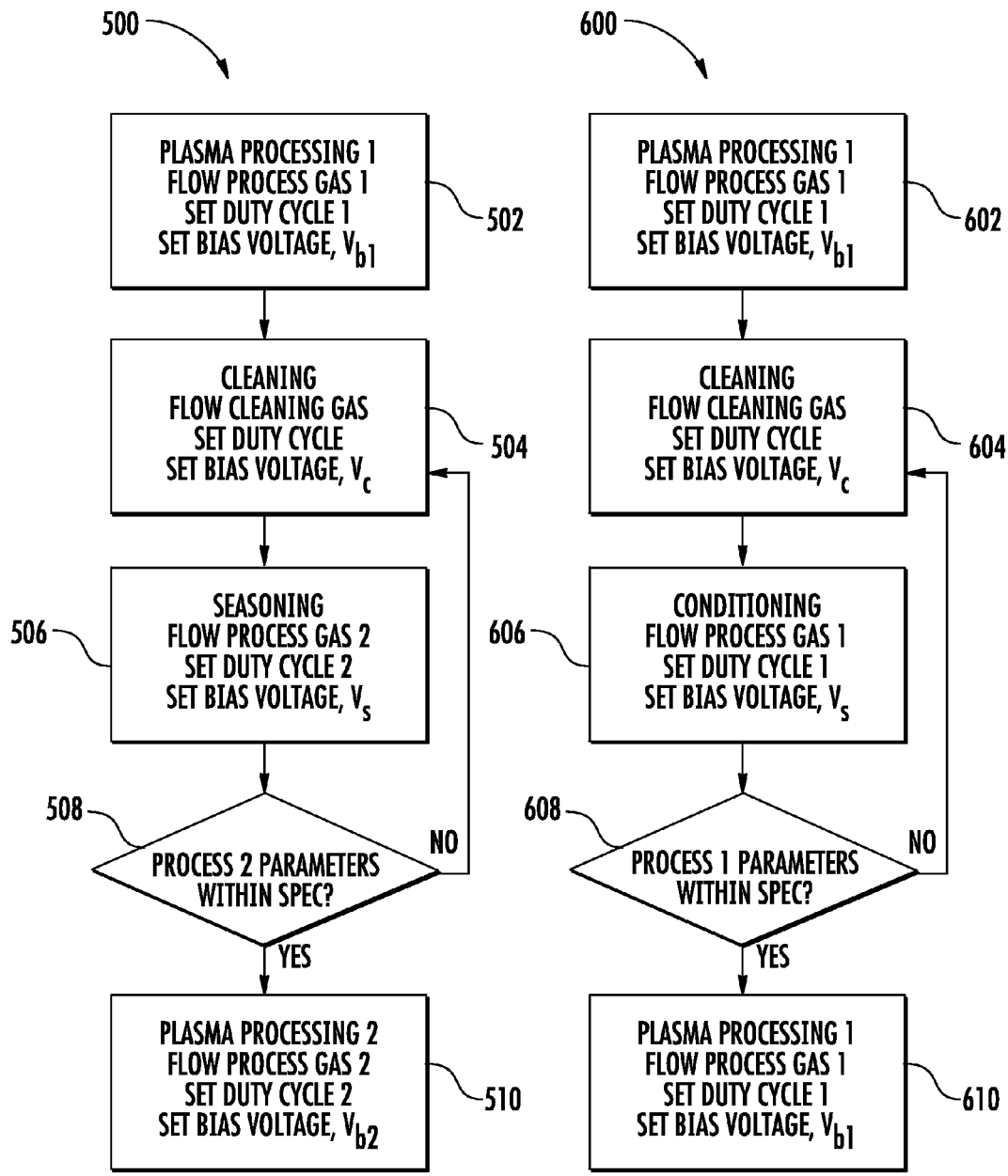
FIG. 5 is a flow chart of one method consistent with the disclosure.
FIG. 6 is a flow chart of another method consistent with the disclosure.

Turning to FIG. 5 a flow chart 500 of one method consistent with the present disclosure is illustrated. A first plasma process is performed in operation 502 with a first process gas input into the process chamber 103. The duty cycle, polarity, and bias voltage ($V_{b1}$) of the bias signal provided by the dual polarity power supply 172 is set according to a particular recipe for the first process. A cleaning operation 504 follows the first plasma process 502. A cleaning gas is input into the process chamber 103 and cleaning plasma is generated. The duty cycle, polarity, and bias voltage ($V_C$) of the bias signal provided by the dual polarity power supply 172 is set according to a particular recipe for the cleaning process to direct ions towards the interior surfaces of the process chamber housing for cleaning. An optional conditioning or seasoning operation 506 may then be performed to treat the interior surfaces of the process chamber housing 102 and components in the process chamber 103 with a new chemical species consistent with the second process gas. If the second process parameters are not within specification 508, then additional cleaning can be performed 504. If the second process parameters are within specification, then the second plasma process 510 may be performed. The duty cycle, polarity, and bias voltage ($V_{b2}$) of the bias signal provided by the dual polarity power supply 172 is set according to a particular recipe for the second plasma process. The method of FIG. 5 enables two different species (e.g., p-type and n-type species) to be used in the same process chamber 103 while minimizing any cross contamination issues due to deposits of one type adversely impacting process conditions of an opposite type.

Turning to FIG. 6, a flow chart 600 of another method consistent with the present disclosure is illustrated where only one species is used in the process chamber and periodic cleaning is desired. Operations 602 and 604 are similar to previously detailed operations 502 and 504. An optional conditioning or seasoning operation 606 may then be performed to treat the interior surfaces of the process chamber housing 102 and components in the process chamber 103 with the same chemical species previously utilized in operation 602. If the first process parameters are not within specification 608, then additional cleaning can be performed 604. If the first process parameters are within specification, then the first plasma process 610 may be performed again. The duty cycle, polarity, and bias voltage ($V_{b1}$) of the bias signal provided by the dual polarity power supply 172 may be set similarly to the first operation 602.

Accordingly, there is thus provided plasma processing apparatus having a biasing system configured to bias a platen to repel ions from the platen towards interior surfaces of the process chamber housing during a cleaning time interval. A method of generating a cleaning plasma from a cleaning gas, and accelerating ions of the cleaning plasma towards interior surfaces of the process chamber housing during a cleaning time interval is also provided. One advantage of this cleaning process is that the flow rate of the cleaning gas may be kept as low as about 1-20 SCCM compared to conventional flow rates as high as 500-2,000 SCCM. The process chamber may also be operated a pressure of less than or equal to 10 mTorr compared to conventional cleaning procedures which operate at a high pressure as high as several hundred mTorr to a few Torr during cleaning. Efficiency in is switching between species in the same process chamber is facilitated and cross contamination concerns are minimized with effective cleaning.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method comprising:
inputting a first process gas into a process chamber;
generating a first plasma from the first process gas;
attracting ions of the first plasma towards a workpiece by biasing a platen positioned in the process chamber on which the workpiece is disposed with a negatively biased DC signal during a first processing time interval;
stopping a flow of the first process gas into the process chamber;
inputting a cleaning gas into the process chamber;
generating a cleaning plasma from the cleaning gas; and accelerating ions of the cleaning plasma towards interior surfaces of the process chamber housing during a cleaning time interval separate from the first processing time interval, by biasing the platen with a positively biased DC signal.

2. The method of claim 1, wherein the positively biased DC signal comprises a pulsed DC signal having an amplitude equal to or greater than 1 kilovolt.

3. The method of claim 1, further comprising:
stopping a flow of the cleaning gas into the process chamber;
inputting a second process gas into the process chamber after the cleaning time interval; and
generating a second plasma from the second process gas.

4. The method of claim 3, wherein the first process gas comprises a p-type dopant and the second process gas comprises an n-type dopant.

5. The method of claim 4, further comprising accelerating ions from the second plasma towards interior surfaces of the process chamber housing during a conditioning time interval, the conditioning time interval occurring after the cleaning time interval and before the second processing time interval to condition the interior surfaces of the process chamber before the second processing time interval.

6. The method of claim 5, wherein the accelerating ions during the cleaning time interval comprises biasing the platen positioned in the process chamber with a positively biased pulsed DC signal having a first amplitude, and wherein the accelerating ions during the conditioning time interval comprises biasing the platen with a positively biased DC signal having a second amplitude less than the first amplitude.

7. The method of claim 1, further comprising maintaining a pressure in the process chamber at less than or equal to 10 mTorr during the first processing time interval and the cleaning time interval.

8. A method comprising:
inputting a first process gas comprising a p-type dopant into a process chamber;
generating a first plasma from the first process gas;
attracting ions of the first plasma towards a workpiece by biasing a platen positioned in the process chamber on which the workpiece is disposed with a negatively biased DC signal during a first processing time interval;
stopping a flow of the first process gas into the process chamber;
inputting a cleaning gas into the process chamber;
generating a cleaning plasma from the cleaning gas;
accelerating ions of the cleaning plasma towards interior surfaces of the process chamber housing during a cleaning time interval separate from the first processing time interval, by biasing the platen with a positively biased DC signal of a first amplitude;
stopping a flow of the cleaning gas into the process chamber;
inputting a second process gas comprising a n-type dopant into a process chamber;
generating a second plasma from the second process gas;
accelerating ions of the second plasma towards interior surfaces of the process chamber housing during a conditioning time interval separate from the first processing time interval and the cleaning time interval, by biasing the platen with a positively biased DC signal of a second amplitude, less than the first amplitude; and
attracting ions of the second plasma towards a workpiece by biasing the platen with a negatively biased DC signal during a second processing time interval, separate from the first processing time interval, the cleaning time interval and the conditioning time interval.

9. The method of claim 8, wherein the first amplitude is equal to or greater than 1 kilovolt.

10. The method of claim 9, wherein the second amplitude is between 100 and 500 volts.

* * * * *